June 20, 1967 P. M. KISINKO 3,327,182

SEMICONDUCTOR INTEGRATED CIRCUIT STRUCTURE AND METHOD OF MAKING THE SAME

Filed June 14, 1965

WITNESSES

*Theodore F. Wrobel*

*James G. Young*

INVENTOR.

Paul M. Kisinko

BY

*Gordon H. Telfer*

ATTORNEY

United States Patent Office 3,327,182

Patented June 20, 1967

3,327,182

SEMICONDUCTOR INTEGRATED CIRCUIT STRUCTURE AND METHOD OF MAKING THE SAME

Paul M. Kisinko, Greensburg, Pa., assignor to Westinghouse Electric Corporation, Pittsburgh, Pa., a corporation of Pennsylvania Filed June 14, 1965, Ser. No. 463,705
4 Claims. (Cl. 317—235)

Figure 4:
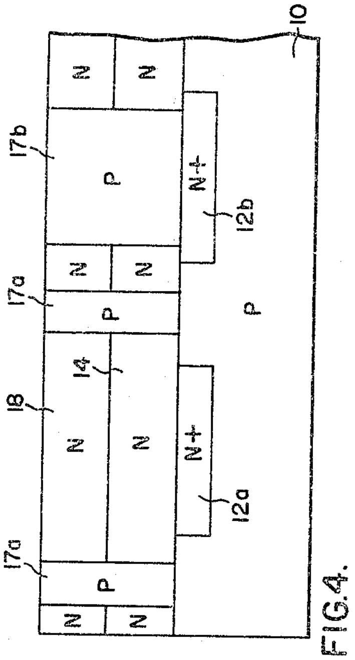

This invention relates generally to semiconductor integrated circuits and, more particularly, to semiconductor integrated circuits intended to provide the functions of a pair of complementary transistors, and methods of making the same.

Fabrication of transistor structures by three successive diffusion operations to form collector, base and emitter regions is generally unsatisfactory because the resulting doping levels are not compatible with good device characteristics. For example, in the diffusion of the collector region, the surface concentration must be relatively high in order to obtain adequate depth. Consequently, the surface concentrations of the subsequently diffused base and emitter regions must be even higher. These relatively high surface concentrations limit the breakdown voltages of the transistor junctions.

In most instances, triple diffused transistors can be avoided because of the availability of more satisfactory fabrication schemes such as epitaxial growth and double diffusion. However, in instances in which it is desired to form transistors of both NPN and PNP polarities in a semiconductor integrated circuit it may be required to form one of the transistors by triple diffusion, hence, resulting in the above-mentioned unsatisfactory breakdown voltage of the collector-base junction that is typically about 25 volts in triple diffused structures. For a description of prior proposals to form complementary transistor structures, reference should be made to Electronic News, Apr. 22, 1963, p. 4, article entitled, "NPN/PNP Single Substrate Transistors."

It is, therefore, an object of the present invention to provide an improved semiconductor integrated circuit structure, and method of making it, for providing the functions of a complementary pair of transistors of which each has relatively good characteristics.

Another object is to provide a semiconductor integrated circuit structure including a triple diffused transistor having a relatively high collector-base breakdown voltage.

Another object is to provide an improved method of fabricating complementary transistors within semiconductor integrated circuits that is thoroughly compatible with existing fabrication techniques.

The invention, in summary, achieves the above-mentioned and additional objects and advantages in a structure including transistors of both polarities of which one is formed by triple diffusion but which has an impurity concentration gradient in the collector region that is a maximum away from the base-collector junction so that the base-collector junction breakdown voltage is increased, typically, to about 65 volts.

In accordance with the method of this invention, the collector region of the triple diffused transistor is formed by a deposition of doping impurity material between epitaxially grown layers. Upon redistribution the diffused collector extends through the epitaxial layers and has its maximum impurity concentration away from the surface. Consequently, the impurity concentrations in subsequent diffusion operations need not be as high as in normal triple diffused structures and breakdown voltage is greater.

Conveniently, the method in accordance with this invention may be easily practiced in keeping with prior fabrication schemes. For example, the diffused collector region may be performed in the same operations as for the formation of diffused isolation walls. Also, the emitter and base regions diffused into the diffused collector may be formed by redistribution of impurities simultaneously with those for emitter and base regions in transistors of opposite polarities and those for regions providing resistor or diode or capacitor functions.

Figure 5:
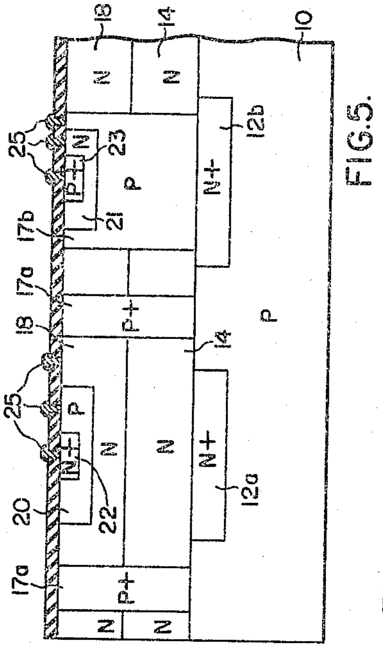
Figure 6:
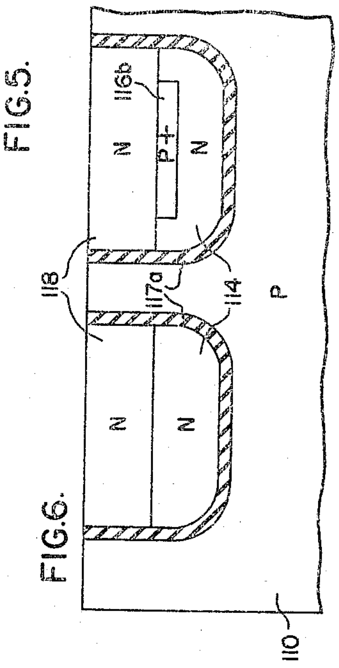
Figure 1:
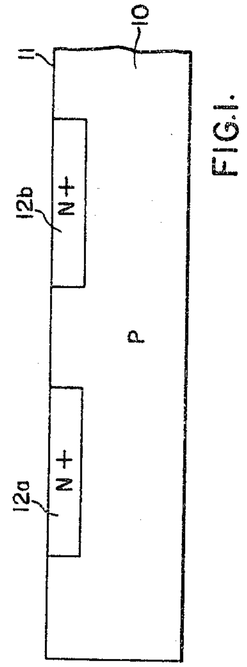
Figure 2:
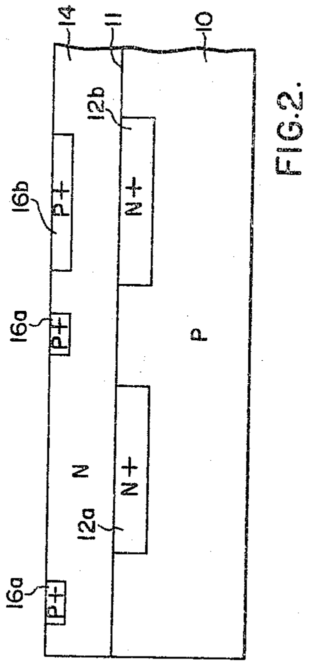
Figure 3:
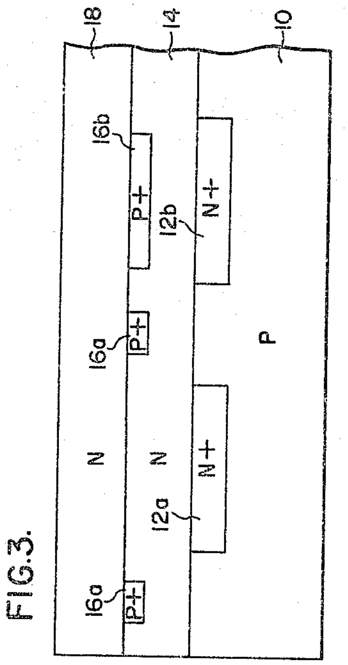

The invention together with the above-mentioned additionally objects and advantages will be better understood by reference to the following description taken with the accompanying drawing wherein:

FIGURES 1 through 5 are partial sectional views of a semiconductor integrated circuit at successive stages in the fabrication process in accordance with this invention; and FIG. 6 is a partial sectional view of an alternative form of the present invention at a stage in the fabrication process corresponding generally to that of FIG. 3.

The figures of the drawing are not to scale and some dimensions have been greatly exaggerated for clarity.

The invention will be described in terms of its practice with silicon semiconductor material as the individual process operations of selective impurity diffusion, epitaxial growth and others are well known for silicon. However, it is to be understood that the invention may be practiced with other semiconductor materials.

While the description is concerned with exemplary embodiments wherein individual regions are assigned semiconductivity of a particular type, it is to be understood that the semiconductivity type of the various regions may be reversed from that shown.

Referring to FIG. 1 there is shown a body 10 of starting material that provides a substrate or support member for the regions and layers to be formed in successive operations. In this example the substrate 10 is of P-type semiconductivity and has a planar surface 11 in which are disposed two regions **12*a* and 12*b*** of N-type semiconductivity.

The substrate may, in accordance with prior integrated circuit techniques, be of P-type silicon having a resistivity of about 10 ohm-centimeters. Preferably, its surface should have an orientation near <111> to facilitate the deposition of epitaxially grown layers thereon to provide a good continuation of the monocrystalline structure and preserve planarity of the exposed surface of the structure.

The regions **12*a* and 12*b* may be formed by conventional oxide masking and diffusion techniques to a typical surface concentration of about $10^{18}$ atoms per cubic centimeter and a depth of about 3 microns. As the regions 12*a* and 12*b* have relatively high impurity concentrations they are designated as being of N+ type. They are located in positions desired for the transistor collector regions in the ultimate integrated circuit as will be apparent from the following description. As the structure is exposed to several different heating operations subsequent to the formation of regions 12*a* and 12*b***, it is desirable to employ a doping impurity that has a slow diffusion rate so as to not spread that impurity too extensively throughout the structure. It has been found that arsenic is a suitable N-type impurity for this purpose.

FIG. 2 shows the structure after there has been formed on the surface 11 an epitaxial layer 14 of N-type semiconductivity. Layer 14 may be formed by a conventional silicon epitaxial growth operation such as the thermal decomposition with hydrogen of silicon tetrachloride with a suitable amount of phosphorous included among the reactants to give the desired resistivity to the layer 14. Typically, layer 14 may have resistivity within the range of from about 0.8 to about 10 ohm-centimeters and a thickness of about 6 microns.

In the exposed planar surface of the layer 14 are deposited quantities of P-type doping impurity 16*a* and 16*b*. Impurity deposition 16*a* is performed in a pattern outlining the functional elements of the integrated circuit as it is this quantity of doping material that provides the isolation walls between elements in the ultimate integrated circuit.

The impurity deposition 16*b* is disposed over one of the regions 12*b* as the impurities in this deposition provide the collector region in the ultimate structure of the triple diffused transistor in accordance with this invention. The depositions 16*a* and 16*b* may conveniently be of boron deposited through a silicon dioxide mask to a surface concentration of about $5\times10^{20}$ per atoms cubic centimeter.

FIG. 3 shows the structure after there has been deposited by epitaxial growth an additional epitaxially grown layer 18 over layer 14. Layer 18 may, in resistivity and thickness, be like that of layer 14.

The combined thickness of the epitaxial layers 14 and 18 is selected in accordance with the desired thickness in the ultimate functional elements of the integrated circuit. The resistivity of at least layer 18 is chosen in accordance wtih the desired collector region resistivity in NPN transistors in the ultimate integrated circuit. For optimum transistor characteristics it is preferred that the layer 14 be of lower resistivity than layer 18.

FIG. 4 shows the structure after redistribution of the impurities in depositions 16*a* and 16*b* to form the P-type regions 17*a* and 17*b*, respectively, that extend completely through the epitaxial layers 14 and 18. The redistribution of impurities may be performed conventionally.

The structure is now complete in respect to isolation wall 17*a* that provides electrical isolation between adjacent functional elements. Also, the collector regions of the intended complementary pair of transistors are now present. In the left-hand portion of the structure a collector region for an NPN transistor is provided by, in combination, the portions of epitaxial layers 14 and 18 enclosed by the isolation wall 17*a* and the diffused N+ region 12*a*. In the right-hand portion of the illustrated structure the collector region for PNP transistor is provided by region 17*b*. The underlying N+ region 12*b* is present in order to prevent the P-type collector region 17*b* from having direct connection with the P-type substrate 10.

The P-type collector region 17*b* has an impurity concentration profile that diminishes away from the center of the region so that at the surface of region 17*b* it is relatively low such as no more than about $10^{16}$ atoms per cubic centimeter.

FIG. 5 shows the structure after subsequent operations have been performed to complete the complementary transistor elements in the integrated circuit. In the portion 18 of the N-type collector in the left-hand structure there have been formed, by successive diffusion operations, P-type region 20 and N+ region 22 to provide base and emitter regions, respectively, of the NPN transistor.

In the right-hand structural portion there have been formed within P-type region 17*b* by successive diffusion operations N-type region 21 and P+ region 23 that, respectively, provided base and emitter regions in the PNP transistor structure.

Contacts 25 are disposed on each of the emitter, base and collector regions in each of the transistor structures.

It is preferred in accordance with this invention to minimize the operations by which the regions 20, 21, 22 and 23 are formed. This may be done by depositing on the surface of layer 18 a P-type doping impurity in the position desired for the base region 20; depositing on the surface of region 17*b* an N-type doping impurity in the position desired for the base region 21 and simultaneously redistributing the impurities so deposited so that the impurity gradient and depth of junctions of the two base regions are approximately equal. Similarly, impurities may be deposited for the regions 22 and 23 that provide emitters in the respective transistors and they may be simultaneously redistributed to the desired impurity profile for the emitter regions.

Naturally, a typical integrated circuit includes a considerable number of additional elements that may include resistors, capacitors, diodes and other transistors. They may, advantageously, be formed in impurity deposition and redistribution operations as employed for the regions of the transistor structures here and hence the method in accordance with this invention does not unduly complicate present integrated circuit fabrication.

The present invention has been described embodied in an integrated circuit wherein internal isolation is provided by a diffused wall 17*a*. However, it is to be understood that principal features of the invention involving the formation of one of the collector regions of the complementary pair by the deposition of impurities between successive epitaxially grown layers may be practiced in accordance with the techniques of isolation by a dielectric medium.

For example, FIG. 6 shows a structure including a support member 110 of polycrystalline silicon in which there are depressions lined with an insulating material 117*a* that may conveniently be of silicon dioxide. In each of the depressions there is a quantity of device quality silicon formed of the epitaxially grown layers 114 and 118. In the right-hand portion of the structure between the epitaxial layers is an impurity deposition 116*b* that upon subsequent redistribution will form a P-type region suitable for a collector region of the PNP transistor in accordance with this invention. Layers 114 and 118 may be formed by epitaxial growth on a substrate that is subsequently removed.

For further information regarding the formation of oxide isolated structures in which the present invention may be practiced reference should be made to copending application of Murphy et al., Ser. No. 410,666, filed Nov. 12, 1964 and assigned to the assignee of the present invention.

While the present invention has been shown and described in a few forms only it will be understood that various changes and modifications may be made without departing from the spirit and scope thereof.

What is claimed is:

1. A semiconductor integrated circuit structure for providing complementary transistor functions comprising: a unitary structure including a substrate of semiconductive material of a first conductivity type, first and second electrically isolated portions of semiconductive material disposed on said substrate, an isolation wall of said first conductivity type extending between said portions; said substrate, said portions and said isolation wall being united in monocrystalline relation; an NPN transistor in said first portion and a PNP transistor in said second portion, each transistor including successively positioned emitter, base and collector regions with junctions therebetween terminating at a single planar surface, said junction between said base and collector regions enclosing said junction between said emitter and base regions; each of said collector regions having a doping impurity concentration that increases away from the junction with said base region before any decrease in said doping impurity concentration.

2. The subject matter of claim 1 wherein: said PNP transistor collector region is disposed in a region of material of said second portion that has the same conductivity type, resistivity and impurity concentration profile as the collector region of said NPN transistor, said first conductivity type being P type.

3. The subject matter of claim 2 wherein: said isolation wall has the same resistivity and impurity concentration profile as the collector region of said PNP transistor.

4. The subject matter of claim 2 wherein: the collector region of said NPN transistor includes an N+ portion spaced from the junction with the base region and a like N+ portion occurs in said second portion with the collector of said PNP transistor extending thereto.

References Cited

Electronic Design, vol. 12, No. 8, Apr. 13, 1964, pp. 12–14.

JOHN W. HUCKERT, *Primary Examiner.*

M. EDLOW, *Assistant Examiner.*